United States Patent
Im et al.

(10) Patent No.: US 6,677,870 B2
(45) Date of Patent: Jan. 13, 2004

(54) DEVICE AND METHOD FOR COMPENSATING FOR NONLINEARITY OF POWER AMPLIFIER WITH PREDISTORTION IN IF BAND

(75) Inventors: Sungbin Im, Seoul (KR); Chonghoon Kim, Seoul (KR); Yoan Shin, Seoul (KR)

(73) Assignees: Solid Technologies, Inc., Seoul (KR); Versatek Telecom, Inc., Anaheim, CA (US)

( * ) Notice: Subject to any disclaimer, the term of this patent is extended or adjusted under 35 U.S.C. 154(b) by 0 days.

(21) Appl. No.: 10/081,645

(22) Filed: Feb. 21, 2002

(65) Prior Publication Data

US 2002/0187761 A1 Dec. 12, 2002

(30) Foreign Application Priority Data

Feb. 21, 2001 (KR) .......................................... 2001-8798

(51) Int. Cl.[7] ................................................ H03M 1/00
(52) U.S. Cl. ...................................... 341/110; 375/297
(58) Field of Search ................................ 341/110, 155, 341/144, 156, 145, 126; 375/220, 297, 296

(56) References Cited

U.S. PATENT DOCUMENTS

| | | | | |
|---|---|---|---|---|
| 5,596,600 A | * | 1/1997 | Dimos et al. ............... | 375/148 |
| 5,910,965 A | * | 6/1999 | Ierfino et al. ............... | 375/220 |
| 5,920,808 A | * | 7/1999 | Jones et al. .................. | 455/127 |
| 5,937,011 A | * | 8/1999 | Carney et al. ............... | 375/297 |
| 5,959,500 A | * | 9/1999 | Garrido ....................... | 330/151 |
| 6,415,001 B1 | * | 7/2002 | Li et al. ...................... | 375/259 |

* cited by examiner

Primary Examiner—Brian Young
Assistant Examiner—John Nguyen
(74) Attorney, Agent, or Firm—Lahive & Cockfield, LLP

(57) ABSTRACT

A device for compensating for the nonlinearity of a power amplifier which has a simple configuration and can precisely linearize the transfer characteristics of the power amplifier by predistorting an input signal of the power amplifier. The nonlinearity compensation device of the present invention converts an RF input signal into an IF band rather than a baseband and predistorts the RF input signal in digital domain, and thus any modulation or demodulation process is obviated and the simultaneous processing of signals in multiple channels is facilitated. A first downconverter receives the RF input signal and converts the frequency band of the signal into the IF band to output an IF input signal. A predistortion unit receives and predistorts the IF input signal to compensate for the nonlinearity, and outputs an IF predistorted signal. An upconverter converts the frequency band of the IF predistorted signal into the RF band to provide such a signal to the amplifier.

18 Claims, 3 Drawing Sheets

DEVICE AND METHOD FOR COMPENSATING FOR NONLINEARITY OF POWER AMPLIFIER WITH PREDISTORTION IN IF BAND

RELATED APPLICATION

The current application claims priority from Korean Patent Application Number 2001-0008798, entitled DEVICE FOR LINEARIZING POWER AMPLIFIER WITH PREDISTORTION IN IF BAND, which was filed on Feb. 21, 2001, all naming the same inventors and the same assignees as this application, which is incorporated by reference herein.

BACKGROUND OF THE INVENTION

1. Field of the Invention

The present invention relates to a power amplifier and, more particularly, to a circuit for correcting nonlinear behavior of the power amplifier and a power amplification system employing the circuit. Additionally, the present invention relates to a method for compensating for nonlinearity of the power amplifier. This application for the power amplifier correction circuit is based on Korean patent application No. 2001-8798, which is incorporated by reference herein for all purposes.

2. Description of Related Arts

A signal transmission stage of a wireless communications system typically includes at least one high power amplifier (HPA) for providing enough power gain to a transmitted signal. Examples of the apparatus or subsystem employing such high power amplifier include satellites and control stations in a satellite communications system, mobile stations and base stations in a cellular communications network, and signal transmission units in a broadcasting system. Intrinsically, the high power amplifier shows nonlinear behavior, which distorts phase and amplitude characteristics of an input signal and introduces or increases intermodulation distortion. Considering the trend that the frequency bandwidth of communication systems is being widened and the use of multiple carriers is generalized, the intermodulation distortion is not preferable because it influences neighboring frequency bands or frequency allocations. Thus, the intermodulation distortion is restricted within a certain limit, the details of which depend on applications. Since the nonlinearity of the high power amplifier increases with the magnitude of its output power, manufacturers or service providers usually use a plurality of amplifiers in combination with a power divider and a power combiner so as to reduce the distortion even when a single power amplifier has sufficient power rating, which increases manufacturing cost or network construction cost.

One approach for reducing the nonlinearity effect of the high power amplifier is the use of a feed-forward distortion correction circuit. Such circuits are disclosed, for example, in U.S. Pat. No. 4,629,996 issued Dec. 16, 1986 to Tatsuo Watanabe et al. and entitled FEED-FORWARD MICROWAVE POWER AMPLIFIER WITH DIFFERENCE SIGNAL DISTORTION CANCELLATION CIRCUIT and U.S. Pat. No. 5,148,117 issued Sep. 15, 1992 to Ashok K. Talwar and entitled ADAPTIVE FEED-FORWARD METHOD AND APPARATUS FOR AMPLIFIER NOISE REDUCTION. According to this method, the distortion in the output signal of the amplifier is extracted and amplified to an appropriate level in a feed-forward path, and then injected to the output terminal of the amplifier through a directional coupler so as to compensate for the nonlinearity effect. The amplification of the distortion in the feed-forward path, however, requires a separate amplifier showing linear behavior and the precise calibration of analog components, which increase the system costs.

Another approach for reducing the nonlinearity effect of the high power amplifier is the predistortion of the input signal. According to this method, the input signal is predistorted in front of the power amplifier according to a modeling scheme which is the inverse of the distortion caused by the power amplifier. The inverse modeling scheme may be adaptively adjusted so that the predistortion level is changed according to the magnitude of the output signal. U.S. Pat. No. 6,118,335 issued Sep. 12, 2000 to Jorgen S. Nielson et al. and entitled METHOD AND APPARATUS FOR PROVIDING ADAPTIVE PREDISTORTION IN POWER AMPLIFIER AND BASE STATION UTILIZING THE SAME and U.S. Pat. No. 6,141,390 issued Oct. 31, 2000 to Armando Kova and entitled PREDISTORTION IN A LINEAR TRANSMITTER USING ORTHOGONAL KERNELS may be the evidences of the method.

In the conventional predistortion apparatuses, however, the predistortion of the input signal is typically carried out in baseband. Accordingly, separate signal processing circuits need to be provided for an in-phase component (I) and a quadrature component (Q) of the baseband signal, which increases the complexity of the circuit. In the case that the predistortion is performed by digital signal processing, the software algorithm or computation burden might be increased as well. Further, the complexity of the amplifying stage and resulting increase of the manufacturing cost are more severe in a wideband communications system or a system using plural carriers since the high power amplifier and the predistortion circuit is to be provided for each channel or frequency assignment.

In U.S. Pat. No. 5,877,653 issued Mar. 2, 1999 and entitled LINEAR POWER AMPLIFIER AND METHOD FOR REMOVING INTERMODULATION DISTORTION WITH PREDISTORTION SYSTEM AND FEED FORWARD SYSTEM, Kim et al. describe a system in which the intermodulation distortion is removed using both the predistortion scheme and the feed-forward scheme. Such a system, however, may complicate the system configuration further.

SUMMARY OF THE INVENTION

To solve the above problems, one object of the present invention is to provide a device for compensating for the nonlinearity of a power amplifier which has a simple configuration and can precisely linearize the transfer characteristics of the power amplifier by predistorting an input signal of the power amplifier.

Another object of the present invention is to provide a method for linearizing the transfer characteristics of an amplifier in a power amplification system to remove the distortion caused by the power amplifier.

In order to achieve one of the above objects, the nonlinearity compensation device of the present invention converts a RF input signal into an IF band rather than a baseband and predistorts the IF input signal in a digital domain. A first downconverter receives the RF input signal and converts the frequency band of the RF input signal into the IF band to output an IF input signal. A predistortion unit receives and predistorts the IF input signal to compensate for the nonlinearity and outputs an IF predistorted signal. An upconverter converts the frequency band of the IF predistorted signal into the RF band to provide a RF predistorted signal to the amplifier. A second downconverter receiving a RF output signal of the amplifier through a coupler connected to an output terminal of the amplifier and converts the frequency band of the RF output signal into the IF band to provide an IF output signal to the predistortion unit. Here, the predistortion unit determines a predistortion level based on the IF input signal and the IF output signal.

In a preferred embodiment, the predistortion unit includes a memory, a look-up table, a first and a second analog-to-digital converters, a mapping and storing unit, a digital-to-analog converter, and a mapping information generator. The look-up table stores mapping information. The first analog-to-digital converter converts the IF input signal into a first digital data. The second analog-to-digital converter converts the IF output signal into a second digital data. The mapping and storing unit receives the first and the second digital data, predistorts the first digital data using the mapping information, and outputs predistorted data corresponding to the first digital data. Also, the mapping and storing unit stores at least some of the first digital data and at least some of the second digital data. The digital-to-analog converter converts the predistorted data into the IF predistorted signal. The mapping information generator generates the mapping information using the first and the second digital data.

According to the method of compensating for nonlinearity of the amplifier for achieving another one of the above objects, (a) the frequency band of a RF input signal is downconverted into an IF band. Subsequently, (b) the downconverted IF signal is predistorted to compensate for the nonlinearity of the amplifier. Finally, (c) the predistorted IF signal is upconverted into the RF band and the upconverted signal is provided to the amplifier so that the amplifier amplifies the upconverted signal.

It is preferable that the step (b) includes the steps of: (b1) providing mapping information; (b2) converting the downconverted IF signal to digital data to generate a first digital data; (b3) determining predistorted data corresponding to the first digital data using the mapping information; and (b4) converting the predistorted data to an analog signal to generate the predistorted IF signal.

The mapping information is periodically updated in a preferred embodiment. For this purpose, an amplified signal output by the amplifier is converted into a second digital data. After a cross correlation value between the first and the second digital data is calculated, the delay between the first and the second digital data is estimated based on the cross correlation value and the delay is compensated. Afterwards, the mapping information is updated by a fixed point iteration based on a predetermined amplifier model using the first and the second digital data.

Preferably, the amplifier model is represented by a third order polynomial of a following equation:

$$y(n) = ax(n) + bx(n)^3$$

$$a = \frac{\sum_{n=0}^{L-1} x(n)y(n) \sum_{n=0}^{L-1} x^6(n) - \sum_{n=0}^{L-1} x^3(n)y(n) \sum_{n=0}^{L-1} x^4(n)}{D}$$

$$b = \frac{\sum_{n=0}^{L-1} x^3(n)y(n) \sum_{n=0}^{L-1} x^2(n) - \sum_{n=0}^{L-1} x(n)y(n) \sum_{n=0}^{L-1} x^4(n)}{D}$$

-continued $$\text{where } D = \sum_{n=0}^{L-1} x^2(n) \sum_{n=0}^{L-1} x^6(n) - \left[\sum_{n=0}^{L-1} x^4(n)\right]^2$$

Here, x(n) and y(n) denotes the first and the second digital data, respectively. Also, the fixed point iteration is expressed by a following equation:

$$t_{addr}(k+1) = t_{addr}(k) + \alpha[gt_{addr}(0) - at_{addr}(k) - bt_{addr}(k)^3],$$

where
addr=0, 1, 2, . . . , N−1 (address in the mapping information),
k=0, . . . , M (iteration number),
$t_{addr}$ (0) is an initial value,
g is a linear gain, and
α is a step size (positive number).

The present invention facilitates to linearize an amplified signal by predistorting the input signal of the amplifier based on the fixed point iteration without calculating an inverse function of the transfer function of the amplifier. Since the mapping information in the LUT is updated adaptively, the present invention enables to obtain the consistent amplification behavior regardless of the signal properties and the operation environment such as the temperature of the power amplifier, and allows each device employing components of different figures to have almost the same performance with one another. The present invention enables the mass production and can lowers the manufacturing cost of the device because most portion of the circuit is implemented by use of digital components. Since the nonlinearity compensation device predistorts the signal in the IF band, the present invention obviates any modulation or demodulation process and allows the simultaneous processing of signals in multiple channels.

BRIEF DESCRIPTION OF THE DRAWINGS

The above objectives and advantages of the present invention will become more apparent by describing in detail preferred embodiments thereof with reference to the attached drawings, in which.

DETAILED DESCRIPTION OF PREFERRED EMBODIMENTS

Figure 1:
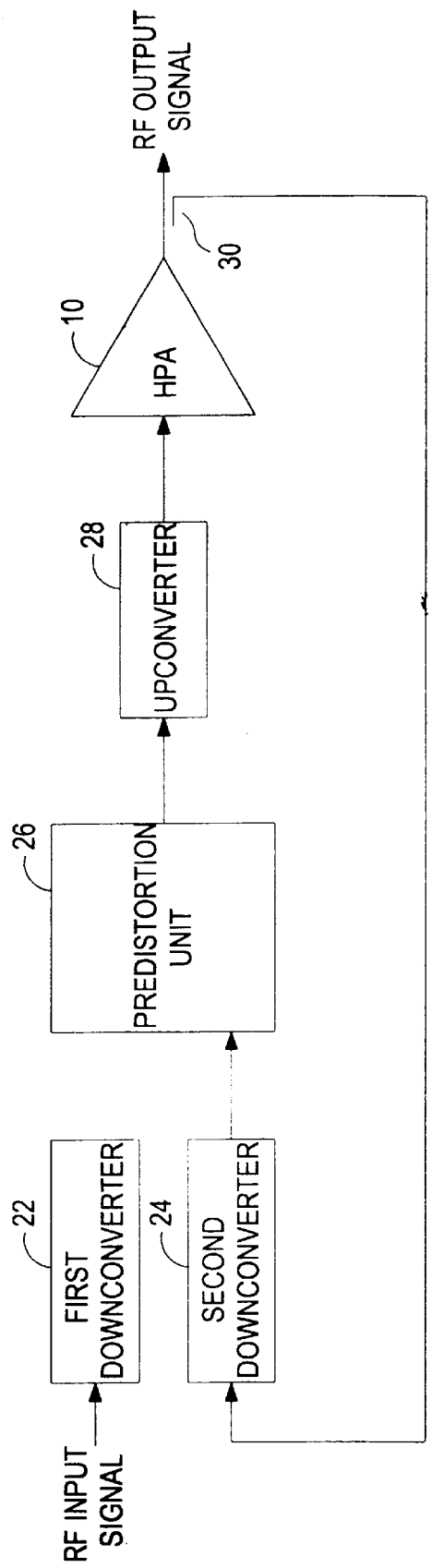
FIG. 1 is a block diagram of a preferred embodiment of a nonlinearity compensation device according to the present invention.

The nonlinearity compensation device shown in FIG. 1, which is suitable for a code division multiple access (CDMA) digital wireless communication system, includes a first downconverter 22, a second downconverter 24, a predistortion unit 26, an upconverter 28, and a coupler 30.

The first downconverter 22 receives a RF input signal (e.g., a digital cellular communication signal in 800 MHZ band) and downconverts the frequency band of such signal into an intermediate frequency (IF) band (for example, 70 MHZ band). The second downconverter 24 receives a RF output signal from the high power amplifier (HPA) 10 through the coupler 30 and downconverts the frequency band of such signal into the IF band. The predistortion unit 26, which includes a look-up table (LUT) described below, receives the IF input signal downconverted by the first downconverter 22 and predistorts the signal based on mapping information stored in the LUT to output an IF predistorted signal. The upconverter 28 restores the frequency band of the predistorted IF signal into the RF band and provides a RF predistorted signal to the HPA 10, so that the HPA 10 amplifies the predistorted RF signal to output the RF output signal.

Figure 2:
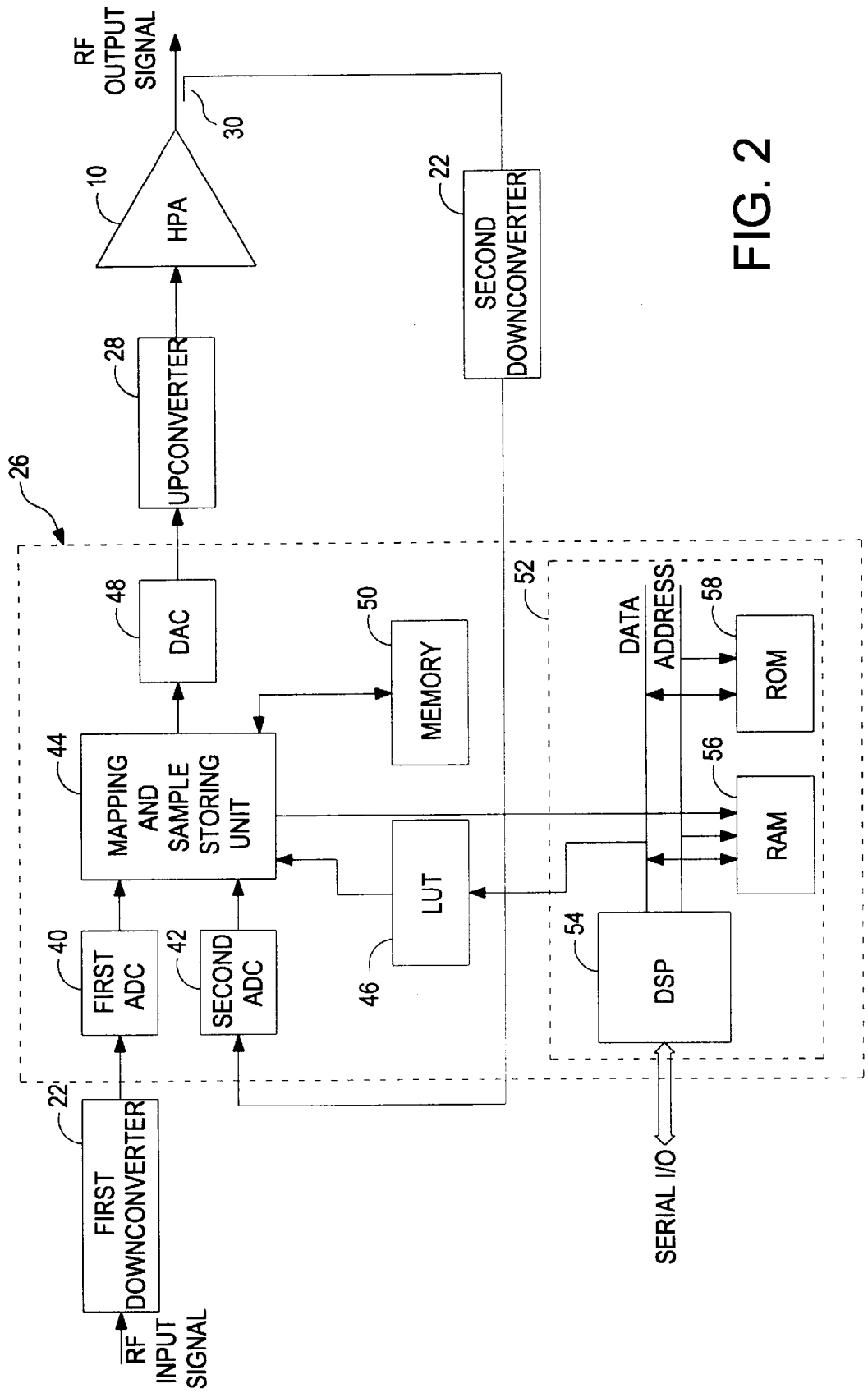
FIG. 2 is a detailed block diagram of the nonlinearity compensation device of FIG. 1.

FIG. 2 illustrates the nonlinearity compensation device of FIG. 1 in more detail. In the predistortion unit 26, a first analog-to-digital converter (ADC) 40 receives the IF input signal downconverted by the first downconverter 22 and converts the signal into digital data by sampling at a rate of 40 Megasample per second (Msps). A second ADC 42 receives the IF output signal downconverted by the second downconverter 24 and converts the signal into digital data by sampling at the rate of 40 Msps. A mapping and sample storing unit 44 predistorts the IF input data from the first ADC 40 by outputting predistortive data to which the IF input data is mapped in the mapping information stored in the LUT 46. Also, the mapping and sample storing unit 44 stores the IF output sample from the second ADC 42 into the memory 50, which preferably is a static random access memory (SRAM). A digital-to-analog converter (DAC) converts the predistorted data output by the mapping and sample storing unit 44 into an analog signal having a bandwidth of 10 MHZ and provides the signal to the upconverter 28.

The LUT 46 stores the mapping information of the IF input data levels and desired predistortive data levels each of which corresponds to a respective IF input data level. It is preferable that the LUT 46 is implemented by use of a dual port random access memory (DPRAM) and thus has an input port separately from an output port. The LUT 46 receives new mapping information from a mapping data generator 52 through the input port and outputs the stored mapping information to the mapping and sample storing unit 44 through the output port and. The mapping information stored in the LUT 46 is periodically updated by the mapping data generator 52.

As mentioned above, the LUT 46 stores the mapping information which is established as data pairs of the IF input data level and desired predistortive data level corresponding to and addressed by the IF input data level in the preferred embodiment. Thus, the mapping and sample storing unit 44 replaces the IF input data level with the desired predistortive data level corresponding to the IF input data level. Alternatively, however, the predistortive data may be established as numerical values for increasing or decreasing the IF input data. In such a case, the mapping and sample storing unit 44 reads the predistortive data from the LUT 46 which are addressed by the IF input data to add positive or negative numerical value of the predistortive data from the LUT 46 to the IF input data, for thereby predistorting the IF input data to a desired level with the predistortive data.

In the preferred embodiment, the mapping data generator 52 is implemented by use of a digital signal processor (DSP) 54. The mapping data generator 52 also includes a RAM 56 for temporarily storing data handled or generated during the signal processing and a ROM 58 for storing a program code for operating the DSP 54. The DSP 54 receives the IF input data and the IF output data stored in the memory 50 from the mapping and sample storing unit 44. Subsequently, the DSP 54 monitors an intermodulation signal spectrum and carries out signal processing with respect to the IF input data and the IF output data to perform a modeling of the HPA 10. The DSP 54 generates or updates the mapping data stored in the LUT 46 according to the modeling result.

Figure 3:
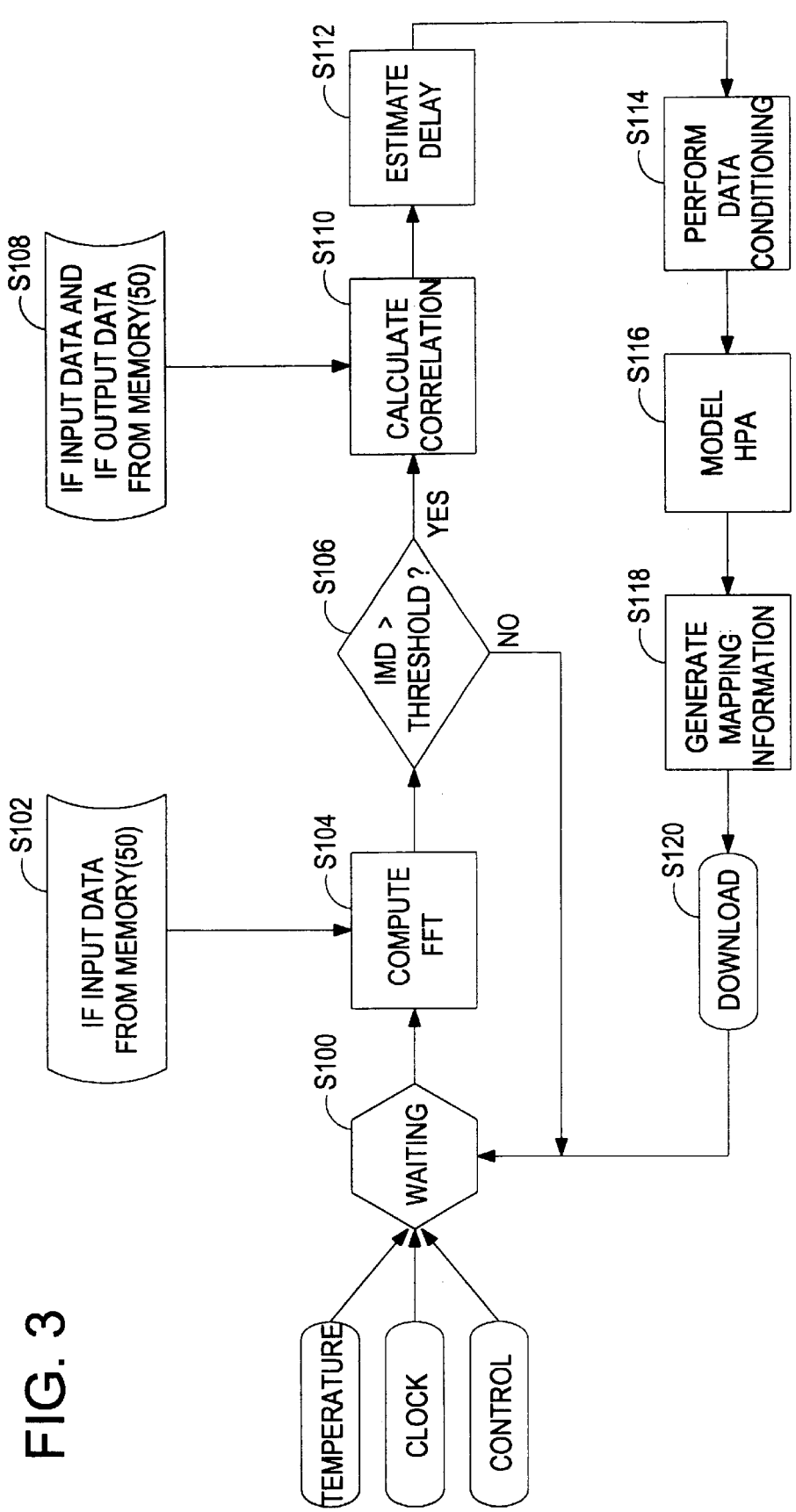
FIG. 3 is a flowchart showing an algorithm for generating or updating look-up table data executed by a digital signal processor shown in FIG. 2.

FIG. 3 illustrates a process of generating or updating data stored in the LUT 46 which is carried out by the DSP 54. The DSP 54 is in a waiting state while continuously receiving a temperature data of the HPA, a clock signal, and an external control signal (step 100). When receiving, in the waiting state, the IF output data sampled by the second ADC 42 and stored in the memory 56, the DSP 54 computes a Fast Fourier transform (FFT) expressed by a following equation (step 104).

$$Y(k) = \sum_{n=0}^{L-1} y(n) W_N^{kn}, \quad k = 0, 1, 2, \ldots, L-1$$

where $W_N = e^{-j(2\pi/N)}$, and y(n) denotes the IF output data and L denotes the length of a block.

The DSP 54 calculates an average of the FFT operation results over several data blocks and determines whether the average of the intermodulation distortion, $E[|Y(K)|^2]$, is greater than a certain threshold (step 106). In the case that the average intermodulation distortion is not greater than the threshold, the DSP 54 returns to the waiting state. If, however, the average intermodulation distortion is greater than the threshold in the step 106, the DSP 54 receives the IF input data and the IF output data sampled by the first and the second ADCs 40 and 42, respectively, from the memory 50 (step 108) to calculate a cross correlation value between them by equation 2 (step 110).

$$c(m) = \frac{1}{L} \sum_{n=0}^{L-m-1} x(n) y(n+m), \quad 0 \le m \le K-1$$

where K is a size of a delay search window.

Based on the cross correlation value c(m), the DSP 54 estimates a time delay between the IF input data and the IF output data corresponding to the IF input data by equation 3 (step 112).

$$d = \arg\max |c(m)|, \quad 0 \le m \le K-1-1$$

Afterwards, the DSP 54 carries out a data conditioning process which includes the compensation of the time delay and the scaling of data, that is, the adjustment of the relative difference in size between the IF input data and the IF output data (step 114). Upon completion of the data conditioning, the DSP 54 performs a modeling of the HPA so as to accommodate the current temperature and signal strength of the input signal, and so on (step 116). In the preferred embodiment, the modeling of the HPA is expressed by a third order polynomial of equation 4, in which a linear and a cubic coefficients (a, b) are calculated by equation 5.

$$y(n) = ax(n) + bx(n)^3$$

$$a = \frac{\sum_{n=0}^{L-1} x(n)y(n) \sum_{n=0}^{L-1} x^6(n) - \sum_{n=0}^{L-1} x^3(n)y(n) \sum_{n=0}^{L-1} x^4(n)}{D}$$

$$b = \frac{\sum_{n=0}^{L-1} x^3(n)y(n) \sum_{n=0}^{L-1} x^2(n) - \sum_{n=0}^{L-1} x(n)y(n) \sum_{n=0}^{L-1} x^4(n)}{D}$$

where $D = \sum_{n=0}^{L-1} x^2(n) \sum_{n=0}^{L-1} x^6(n) - \left[\sum_{n=0}^{L-1} x^4(n)\right]^2$ Also, the DSP 54 generates the mapping information for the LUT (step 118). The generation of the LUT mapping information in the step 118 is performed using a fixed point iteration expressed by equation 6.

$$t_{addr}(k+1) = t_{addr}(k) + \alpha[gt_{addr}(0) - at_{addr}(k) - bt_{addr}(k)^3],$$

where
addr=0, 1, 2, ..., N−1 (address in the LUT),
k=0, ..., M (iteration number),
$t_{addr}(0)$ is an initial value,
g is a linear gain, and
α is a step size (positive number).

Mapping information generated by the steps above is downloaded to the DPRAM to be stored in the LUT 46 or update existing mapping information in the LUT 46 (step 120).

Although the present invention has been described in detail above, it should be understood that the foregoing description is illustrative and not restrictive. Those of ordinary skill in the art will appreciate that many obvious modifications can be made to the invention without departing from its spirit or essential characteristics. Accordingly, the scope of the invention should be interpreted in the light of the following appended claims.

What is claimed is:

1. A device for compensating for nonlinearity of an amplifier, comprising:
    a first downconverter for receiving a RF input signal and converting the frequency band of the RF input signal into an IF band to output an IF input signal;
    a predistortion unit for receiving the IF input signal, predistorting the IF input signal to compensate for the nonlinearity, and outputting an IF predistorted signal;
    an upconverter for converting the frequency band of the IF predistorted signal into a RF band to provide a RF predistorted signal to the amplifier;
    a coupler connected to an output terminal of the amplifier; and
    a second downconverter for receiving a RF output signal of the amplifier through said coupler and converting the frequency band of the RF output signal into the IF band to provide an IF output signal to said predistortion unit,
    wherein said predistortion unit determines a predistortion level based on the IF input signal and the IF output signal.

2. The device as claimed in claim 1, wherein said predistortion unit comprises:
    a memory;
    a look-up table for storing mapping information;
    a first analog-to-digital converter for converting the IF input signal into a first digital data;
    a second analog-to-digital converter for converting the IF output signal into a second digital data;
    a mapping and storing unit for receiving the first and the second digital data, predistorting the first digital data using the mapping information to output a predistorted data corresponding to the first digital data, and storing at least some of the first digital data and at least some of the second digital data;
    a digital-to-analog converter for converting the predistorted data into the IF predistorted signal; and
    a mapping information generator for generating the mapping information using the first and the second digital data.

3. The device of claim 1 wherein the predistortion unit maps the IF input signal to the IF predistorted signal using mapping information in a look-up table.

4. The device of claim 3 wherein the predistortion unit generates the mapping information using fixed point iteration.

5. The device of claim 3 wherein the predistortion unit generates the mapping information based on modeling of the amplifier.

6. The device of claim 5 wherein the modeling of the amplifier accommodates current temperature of the amplifier.

7. The device of claim 3 wherein the predistortion unit updates the mapping information periodically.

8. The device of claim 3 wherein the predistortion unit calculates a cross correlation value between the IF input signal and the IF output signal to generate the mapping information.

9. The device of claim 8 wherein the predistortion unit estimates delay between the IF input signal and the IF output signal based on the cross correlation value between the IF input signal and the IF output signal.

10. The device of claim 9 wherein the predistortion unit compensates for the delay between the IF input signal and the IF output signal to generate the mapping information.

11. The device of claim 3 wherein the predistortion unit generates the mapping information when an average of intermodulation distortion is greater than a predetermined value.

12. A power amplification system for receiving and amplifying a RF input signal, comprising:
    a first downconverter for receiving the RF input signal and converting the frequency band of the RF input signal into an IF band to output an IF input signal;
    a predistortion unit for receiving the IF input signal, predistorting the IF input signal to compensate for the nonlinearity, and outputting an IF predistorted signal;
    an upconverter for converting the frequency band of the IF predistorted signal into a RF band to output a RF predistorted signal;
    an amplifier for receiving and amplifying the RF predistorted signal to output an RF output signal;
    a coupler connected to an output terminal of the amplifier; and
    a second downconverter for receiving the RF output signal through said coupler and converting the frequency band of the RF output signal into the IF band to provide an IF output signal to said predistortion unit,
    wherein said predistortion unit determines a predistortion level based on the IF input signal and the IF output signal.

13. The system as claimed in claim 12, wherein said predistortion unit comprises:

a memory;

a look-up table for storing mapping information;

a first analog-to-digital converter for converting the IF input signal into a first digital data;

a second analog-to-digital converter for converting the IF output signal into a second digital data;

a mapping and storing unit for receiving the first and the second digital data, predistorting the first digital data using the mapping information and output a predistorted data corresponding to the first digital data, and storing at least some of the first digital data and at least some of the second digital data;

a digital-to-analog converter for converting the predistorted data into the IF predistorted signal; and a mapping information generator for generating the mapping information using the first and the second digital data.

14. In a power amplification system including an amplifier for amplifying a RF input signal to a RF output signal, a method of compensating for nonlinearity of the amplifier comprising the steps of:

(a) downconverting the frequency band of the RF input signal into an IF band to provide an IF input signal;

(b) predistorting the downconverted IF input signal to compensating for the nonlinearity of the amplifier; and (c) upconverting the predistorted IF signal into an RF band and providing the upconverted signal to the amplifier so that the amplifier amplifies the upconverted signal to the RF output signal, wherein the RF output signal of the amplifier is received and converted into an IF band to provide an IF output signal, and a predistortion level is determined based on the IF input signal and the IF output signal.

15. The method as claimed in claim 14, wherein said step (b) comprises the steps of:

(b1) providing mapping information;

(b2) converting the downconverted IF signal to digital data to generate a first digital data;

(b3) determining predistorted data corresponding to the first digital data using the mapping information; and (b4) converting the predistorted data to an analog signal to generate the predistorted IF signal.

16. The method as claimed in claim 15, further comprising the steps of:

converting an amplified signal from the amplifier to digital data to generate a second digital data;

calculating a cross correlation value between the first and the second digital data, estimating the delay between the first and the second digital data based on the cross correlation value, and compensating for the delay; and updating the mapping information by a fixed point iteration based on a predetermined amplifier model using the first and the second digital data.

17. The method as claimed in claim 16, wherein the amplifier model is represented by a third order polynomial of a following equation:

$$y(n) = ax(n) + bx(n)^3$$

wherein $x(n)$ and $y(n)$ denotes the first and the second digital data, respectively, wherein a first and a cubic coefficients are calculated by a following equation:

$$a = \frac{\sum_{n=0}^{L-1} x(n)y(n) \sum_{n=0}^{L-1} x^6(n) - \sum_{n=0}^{L-1} x^3(n)y(n) \sum_{n=0}^{L-1} x^4(n)}{D}$$

$$b = \frac{\sum_{n=0}^{L-1} x^3(n)y(n) \sum_{n=0}^{L-1} x^2(n) - \sum_{n=0}^{L-1} x(n)y(n) \sum_{n=0}^{L-1} x^4(n)}{D}$$

$$\text{where } D = \sum_{n=0}^{L-1} x^2(n) \sum_{n=0}^{L-1} x^6(n) - \left[\sum_{n=0}^{L-1} x^4(n)\right]^2$$

18. The method as claimed in claim 16, wherein the fixed point iteration is expressed by a following equation:

$$t_{addr}(k+1) = t_{addr}(k) + \alpha[g t_{addr}(0) - a t_{addr}(k) - b t_{addr}(k)^3].$$

where addr=0, 1, 2, ..., N−1 (address in the mapping information), k=0, ..., M (iteration number), $t_{addr}(0)$ is an initial value, g is a linear gain, and a is a step size (positive number).

* * * * *